United States Patent [19]

Skopil

[11] 4,169,381

[45] Oct. 2, 1979

[54] BIMETAL OPERATED INDICATOR

[75] Inventor: Arthur Skopil, Frankfurt, Fed. Rep. of Germany

[73] Assignee: VDO Adolf Schindling AG, Frankfurt am Main, Fed. Rep. of Germany

[21] Appl. No.: 969,151

[22] Filed: Dec. 13, 1978

Related U.S. Application Data

[63] Continuation of Ser. No. 817,801, Jul. 1, 1977, abandoned.

[30] Foreign Application Priority Data

Jul. 29, 1976 [DE] Fed. Rep. of Germany ....... 2634017

[51] Int. Cl.[2] .......................... G01K 5/54; G01K 5/62
[52] U.S. Cl. .................................. 73/363.5; 73/362.1; 73/431; 116/332; 403/119
[58] Field of Search ................... 73/362.1, 363.5, 431, 73/432 A; 116/328, 332; 33/172 R; 403/119, 261, 263

[56] References Cited

U.S. PATENT DOCUMENTS

| | | | |
|---|---|---|---|
| 811,248 | 1/1906 | Saegmuller | 116/332 |
| 1,617,975 | 2/1927 | Whittier | 73/363.5 X |
| 2,059,272 | 11/1936 | Pickeys | 73/363.5 |
| 2,103,634 | 12/1937 | Nodine | 73/363.5 |
| 2,284,383 | 5/1942 | Elmer | 73/363.5 X |
| 2,405,476 | 8/1946 | Weatherhead, Jr. | 403/119 |
| 2,407,810 | 9/1946 | Boddy | 73/363.5 X |
| 2,716,343 | 8/1955 | Wieszech | 73/363.5 X |
| 2,875,975 | 3/1959 | Hajny | 403/119 X |
| 3,289,630 | 12/1966 | Polonsky | 116/332 |

*Primary Examiner*—Charles Gorenstein
*Attorney, Agent, or Firm*—Otto John Munz

[57] ABSTRACT

A bimetal element operated indicator includes a bimetal carrying a current measuring winding and having a fixed end mounted on a housing, a dial supported on the housing and carrying scale indicia, and a pointer rotatably supported on a stud shaft mounted on the dial and having a driven end coupled with a driving end of the bimetal element such that the pointer is precisely aligned relative to the scale indicia on the dial to provide accurate indicating movement in response to deflection of the bimetal element with temperature change from current in the measuring winding.

9 Claims, 5 Drawing Figures

BIMETAL OPERATED INDICATOR

This is a continuation of application Ser. No. 817,801 filed July 1, 1977 abandoned.

BACKGROUND OF THE INVENTION

1. Field of the Invention

The present invention pertains to bimetal operated indicators and, more particularly, to such indicators having a pointer coupled with a bimetal element and rotatable about a stud shaft mounted on a dial carrying scale indicia thereon.

2. Discussion of the Prior Art

Bimetal operated indicators of the prior art conventionally utilize a pointer supported on a shaft mounted in the housing for the indicator, with a dial carrying scale indicia separately supported or mounted on the housing. Such prior art indicators have the disadvantages that frequently when manufacturing this type of indicator, the scale indicia and the contour of the dial are displaced or misaligned with respect to one another due to the separate operations required therefor, and, further, that misalignment between the pointer and the dial often occurs thereby resulting in intolerable readout indication errors. Additionally, when the bimetal element is coupled to the pointer at a position between the pivot point of the pointer and the indicating tip, a non-linearity relative to the scale indicia results with a further increase in indication error.

SUMMARY OF THE INVENTION

Accordingly, it is an object of the present invention to overcome the above mentioned disadvantages of the prior art by constructing a bimetal operated indicator presenting minimal indication errors.

A primary object of the present invention is to rotatably support a pointer of a bimetal operated indicator on a shaft mounted on the dial of an indicator such that scale indicia on the dial is always precisely registered with movement of the pointer.

Another object of the present invention is to facilitate manufacture of a bimetal operated indicator by simultaneously marking a dial with scale indicia and a position for mounting a shaft for supporting a pointer such that misalignments and indication errors normally resulting from movement of the pointer relative to the scale indicia are minimized.

The present invention has an additional object in that a pointer of a bimetal operated indicator is rotatably supported on a shaft mounted on a dial of the indicator by means of a bearing support portion formed of upstanding flanges having ends bent to intersect to form an opening for receiving the shaft, the shaft having a radially extending head to hold the pointer in place.

The present invention has yet a further object in that a housing for a bimetal operated indicator is cup-shaped and integrally formed of plastic material with locking legs to permit mounting on a printed circuit board and recesses in the bottom of the housing for supporting electrical terminals for connection with a current measuring winding disposed on a bimetal element within the housing. In this manner, connection of the ends of the winding to the terminals is facilitated since such operation can be accomplished externally of the housing and after such connection is made, the terminals can be inserted in the recesses in the bottom of the housing. Additionally, the ends of the winding can be welded to the terminals thereby providing the advantage that insulation which may be formed of, for example, a silk web, need not be removed prior to welding.

Some of the advantages of the present invention over the prior art are that the bimetal operated indicator of the present invention is simple and inexpensive to manufacture, has a small structural volume, has reduced material costs and provides precise alignment for readout indications thereby reducing errors therein.

The present invention is generally characterized in a bimetal operated indicator including a housing, bimetal means carrying a current measuring winding and having a fixed end mounted on the housing and a driving end, a dial supported on the housing and carrying indicia thereon, a pointer having a driven end coupled with the driving end of the bimetal means, and a shaft mounted on the dial and rotatably supporting the pointer whereby the pointer is precisely aligned relative to the indicia on the dial to provide accurate indicating movement of the pointer in response to deflection of the bimetal means with temperature change from current through the winding.

Other objects and advantages of the present invention will become more apparent from the following description of the preferred embodiment taken in conjunction with the accompanying drawings.

DESCRIPTION OF THE PREFERRED EMBODIMENT

Figure 1:
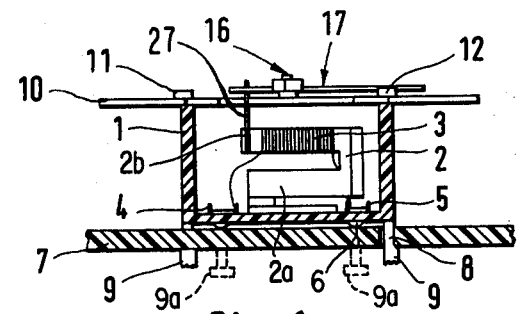
FIG. 1 is a side elevation in section of a bimetal operated indicator according to the present invention.
Figure 2:
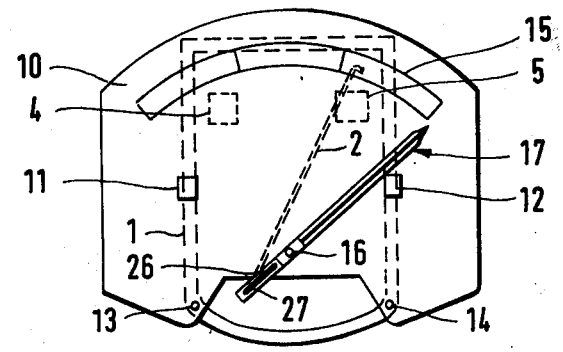
FIG. 2 is a top plan view of the bimetal operated indicator of FIG. 1.

A bimetal operated indicator according to the present invention is shown in FIGS. 1 and 2 and includes a cup-shaped housing made of a plastic material for a U-shaped bimetal leaf spring 2 having a first leg 2a terminating at a fixed end mounted in the housing and a second leg 2b terminating at a driving end, the bimetal element carrying a current measuring winding 3 on leg 2b. Electrical terminals 4 and 5 are disposed in recesses in the bottom of housing 1 with leads connected therefrom to winding 3, and the terminals 4 and 5 are adapted to be connected with conductive lines on an underlying printed circuit board 7 by means of resilient contacts 6 carried on the underside of the housing and connected with the terminals 4 and 5. Resilient locking legs 8 are integrally formed with and depend from housing 1, the locking legs carrying enlarged detents 9 for engaging the printed circuit board.

If desired, the electrical connection with the winding 3 can be accomplished by forming terminals 4 and 5 of electrically conductive nuts and using electrically conductive screws 9a, as shown in phantom in FIG. 1, to electrically connect lines on the printed circuit board 7 with the nut terminals 4 and 5. With this structure, the screws and nuts serve not only to electrically connect the winding 3 with the printed circuit board but also to securely fix the housing 1 to the printed circuit board or other support.

A dial 10 is supported at the top of housing 1 facing an observer and is held in place by outwardly projecting ears 11 and 12 extending through holes on opposite sides of the dial. The dial is aligned with the housing 1 and, therefore, the bimetal element 2 by centering pins 13 and 14 received in corresponding centering holes in the dial, and scale indicia 15 is arcuately arranged on the dial relative to the position of a stud shaft 16 mounted on and extending perpendicularly from a front face of the dial 10 opposite the bimetal element 2. A pointer 17 is rotatably supported by the stud shaft 16 so as to be movable along the scale indicia 15, as best shown in FIG. 2.

Figure 3:
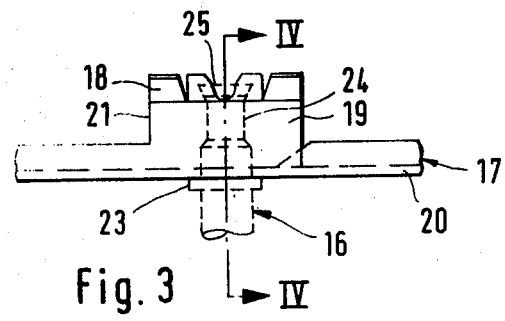
FIG. 3 is an enlarged side elevation of the mounting of the bearing support portion of the pointer on the stud shaft of the bimetal operated indicator of FIG. 1.
Figure 4:
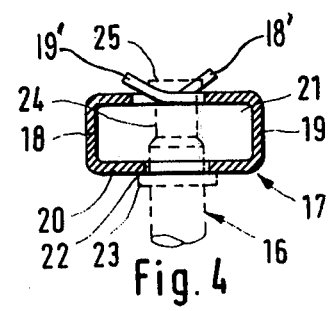
FIG. 4 is a section taken from lines IV—IV of FIG. 3.

The pointer 17 has a shank portion 20 formed in part by a pair of opposite, upwardly extending flanges 18 and 19 to define a bearing support portion 21 for the pointer, the flanges 18 and 19 being bent inwardly toward one another at their edges to define a rectangular cross section for the bearing support portion 21, as best shown in FIGS. 3 and 4. A hole 22 is disposed in the bottom of the bearing support portion 21, and the ends of flanges 18 and 19 form longitudinally offset prongs or tabs 18' and 19' which intersect to define an opening or abutment means aligned with hole 22 to receive the stud shaft 16 which has a shoulder 23 supporting the bottom of the pointer bearing support portion 21 and a circumferential recess 24 forming a radially extending head 25 on the free end of the stud shaft. The recess 24 at the free end of the stud shaft passes through the opening formed by flanges 18 and 19 such that the head 25 is located above the flanges to hold the shank of the pointer on the stud shaft.

The shank portion 20 of the pointer 17 has a driven end with a longitudinal slot or hole 26 therein, and a pin 27 is welded to the driving end of leg 2b of the bimetal element 2 and extends through a cut-out in dial 10 to be received in slot 26. The pin and slot coupling of the bimetal with the pointer is located on the opposite side of stud shaft 16 from the indicating tip of the pointer such that the structural volume of the bimetal operated indicator of the subject invention is less than that of similar prior art instruments.

In operation, current passing through a line or wire on printed circuit board 7 is supplied to winding 3 to heat the bimetal element 2 and cause it to deflect and move pin 27, and the coupling of pin 27 and slot 26 causes the pointer 17 to rotate about stud shaft 16 such that the indicating tip of the pointer overlies a portion of the scale indicia 15 to provide a read-out value. Since the stud shaft 16 is mounted on the dial 10, precise registration of the pointer with the scale indicia is assured to provide an extremely accurate read-out indication. During manufacture, a cross mark for positioning of the stud shaft 16 can be applied to the dial 10 simultaneously with application of the scale indicia thereto such that the pivot point for the pointer can be simply aligned with the scale indicia to minimize errors which could occur from displacement of the pointer relative to the scale indicia. The precise alignment of the pointer with the scale indicia is also enhanced by the axis of rotation of the pointer 17 being arranged between the slot 26 and an intermediate portion of the pointer thereby improving the linearity of the read-out indication.

While the multi-angular cross sectional configuration of the bearing support portion 21 of the shank of the pointer formed by flanges 18 and 19 is advantageous due to the reduced material required and the reduction in weight and size associated therewith, a large bearing block with an axle bore for supporting the pointer could be provided on the stud shaft in place thereof. The use of such a bearing block, however, has the attendant disadvantages of being more difficult and expensive to manufacture and requiring more material.

Figure 5:
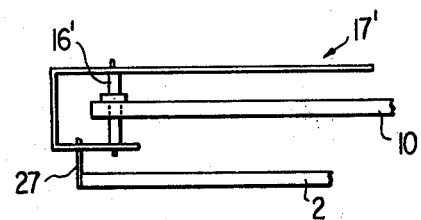
FIG. 5 is a broken side elevation of a modification of the bimetal operated indicator of the present invention.

It is preferred to have the stud shaft 16 extending from the front face of the dial 10 such that the pointer 17 can be easily slid onto the stud shaft via hole 22 and the opening formed by the intersecting ends of flanges 18 and 19; however, if desired, the stud shaft 16 could project from both sides of the dial with the pointer supported on both sides of the stud shaft, as shown in the modification of FIG. 5. Elements in FIG. 5 identical to elements in FIG. 1 are given identical reference numbers and are not described again and the elements of FIG. 5 similar to elements of FIG. 1 are given the same reference numbers with primes. The driven end of the pointer 17' is bent around the dial 10 to define parallel legs on opposite sides of the dial with the lower leg being slotted to receive pin 27 secured to bimetal 2. The stud shaft 16' extends from both sides of the dial 10 to rotatably support the pointer via both legs at the driven end.

Inasmuch as the present invention is subject to many variations, modifications and changes in detail, it is intended that all subject matter described above or shown in the accompanying drawings be interpreted as illustrative and not in a limiting sense.

What is claimed is:

1. A bimetal operated indicator comprising: housing means;
   bimetal means carrying a current measuring winding and having a fixed end mounted on said housing means and a driving end, and a pin carried by the driving end;
   dial means supported on said housing means and carrying indicia;
   said dial means having a front face on a side opposite said bimetal means;
   shaft means mounted on said dial means and extending from said front face and having a free end with a radially enlarged head thereon;
   pointer means having an indicating end and a driven end with a slot therein and having a shank portion between the ends with a hole therein for receiving said shaft means, and a pair of inturned, intersecting flanges on opposite edges thereof defining an opening aligned with said hole to receive said shaft means, said pointer means being held on said shaft means by engagement of said radially enlarged head with said inturned flanges, and said pin received in said slot to drive said pointer means;
   said shaft means rotatably supporting said pointer means whereby said pointer means is precisely aligned relative to said indicia on said dial means to provide accurate indicating movement of said pointer means in response to deflection of said bimetal means with temperature change from current through said winding.

2. A bimetal operated indicator as recited in claim 1 wherein the axis of rotation of said pointer means is arranged between an intermediate portion of said pointer means and said slot.

3. A bimetal operated indicator as recited in claim 2, wherein said bimetal means has a U-configuration with a first leg comprising said fixed end and a second leg comprising said driving end.

4. A bimetal operated indicator as recited in claim 1 wherein said housing means includes a plurality of centering pins and said dial means has a plurality of centering holes receiving said centering pins.

5. A bimetal operated indicator as recited in claim 4 wherein said housing means is cup-shaped and is made of a plastic material.

6. A bimetal operated indicator as recited in claim 5 wherein said housing means has depending locking legs integrally formed therewith.

7. A bimetal operated indicator as recited in claim 6 wherein said housing means includes recesses for receiving electrical connections for said winding.

8. A bimetal operated indicator as recited in claim 1 and further comprising a pair of electrically conductive nuts disposed in said housing means and electrically connected with said winding and a pair of electrically conductive screws extending through said housing means to provide electrical connection with said nuts and to provide means for fastening said housing means to a support.

9. A bimetal operated indicator, comprising: a housing; a dial carried by the housing and having indicia thereon; a bimetallic member having an end fixed to the housing and a free end, and a pin carried by the free end; a pivot shaft carried by the dial and projecting substantially perpindicularly therefrom, said shaft having a radially enlarged head on the end thereof and a shoulder spaced from the head; a pointer having an indicating end and a driven end and having a bearing support portion between the ends thereof pivotally supporting the pointer on said shaft, said bearing support portion being nearer the driven end than the indicating end, and comprising upturned flanges on opposite longitudinal edges of the pointer, the ends of the flanges having tabs thereon longitudinally offset from one another and bent inwardly toward and past one another to define abutment means engaged behind the head on said shaft to retain the pointer on the shaft, said pointer being engaged against and supported on said shoulder on said shaft, and said driven end of said point having a slot therein, said pin on the bimetallic member being engaged in said slot to drive said pointer.

* * * * *